(12) United States Patent
Yeh et al.

(10) Patent No.: US 12,315,741 B2
(45) Date of Patent: May 27, 2025

(54) METHOD OF MANUFACTURING ELECTRONIC DEVICE WITH REDUCED SUBSTRATE WARPAGE

(71) Applicant: InnoLux Corporation, Miao-Li County (TW)

(72) Inventors: Chuan-Ming Yeh, Miao-Li County (TW); Heng-Shen Yeh, Miao-Li County (TW); Sheng-Hui Chiu, Miao-Li County (TW); Kuo-Jung Fan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 382 days.

(21) Appl. No.: 17/850,999

(22) Filed: Jun. 27, 2022

(65) Prior Publication Data

US 2023/0402292 A1    Dec. 14, 2023

(30) Foreign Application Priority Data

Jun. 8, 2022  (CN) .......................... 202210645917.1

(51) Int. Cl.
*H01L 21/48* (2006.01)
*H01L 23/00* (2006.01)

(52) U.S. Cl.
CPC .......... *H01L 21/4857* (2013.01); *H01L 24/13* (2013.01); *H01L 24/81* (2013.01); *H01L 2224/13111* (2013.01); *H01L 2224/13147* (2013.01); *H01L 2224/13155* (2013.01); *H01L 2224/81447* (2013.01); *H01L 2224/81466* (2013.01); *H01L 2224/81815* (2013.01)

(58) Field of Classification Search
CPC ..... H01L 21/4857; H01L 24/13; H01L 24/81; H01L 2224/13111; H01L 2224/13147; H01L 2224/13155; H01L 2224/81447; H01L 2224/81466; H01L 2224/81815; H01L 23/49822; H01L 2224/81

See application file for complete search history.

(56) References Cited

U.S. PATENT DOCUMENTS

| 2007/0090449 A1* | 4/2007 | Choi ....................... H10B 41/41 257/E21.691 |
| 2009/0117497 A1* | 5/2009 | Lee ................... H01L 21/32139 430/323 |
| 2015/0228809 A1* | 8/2015 | Sugiura ................. H01L 29/872 257/485 |

(Continued)

FOREIGN PATENT DOCUMENTS

TW            I731212 B        1/2018

*Primary Examiner* — Douglas W Owens
(74) *Attorney, Agent, or Firm* — Winston Hsu

(57) ABSTRACT

A method of manufacturing an electronic device includes providing a substrate, providing an intermediate layer on the substrate, and providing an isolation layer on the intermediate layer. The substrate includes an active region and a peripheral region. The peripheral region is adjacent to the active region, and the ratio of the area of the active region to the area of the substrate surface is between 75% and 92%. The isolation layer includes a first surface and at least one slope. The first surface of the isolation layer is correspondingly disposed in the active region. The at least one slope of the isolation layer is correspondingly disposed in the peripheral region and at a first angle with respect to the substrate surface.

18 Claims, 6 Drawing Sheets

(56) References Cited

U.S. PATENT DOCUMENTS

| | | | |
|---|---|---|---|
| 2015/0264805 A1* | 9/2015 | Chen | H10K 50/8426 |
| | | | 428/141 |
| 2015/0301652 A1* | 10/2015 | Yang | G06F 3/0412 |
| | | | 345/174 |
| 2017/0287952 A1* | 10/2017 | Li | H01L 27/124 |
| 2019/0148474 A1* | 5/2019 | Bu | H01L 27/1218 |
| | | | 257/40 |
| 2020/0051969 A1* | 2/2020 | Willemen | H01L 29/0688 |
| 2020/0343096 A1 | 10/2020 | Hsu | |
| 2021/0226053 A1* | 7/2021 | Hoshi | H01L 29/7811 |
| 2021/0384476 A1* | 12/2021 | Sim | H04M 1/0214 |
| 2023/0275031 A1* | 8/2023 | Hu | H01L 23/562 |
| 2024/0014275 A1* | 1/2024 | Sanda | H01L 29/404 |

\* cited by examiner

METHOD OF MANUFACTURING ELECTRONIC DEVICE WITH REDUCED SUBSTRATE WARPAGE

BACKGROUND OF THE DISCLOSURE

1. Field of the Disclosure

The present invention provides a method of manufacturing an electronic device, and more particularly, to a method of manufacturing an electronic device with reduced substrate warpage.

2. Description of the Prior Art

Among various wafer-level packaging technologies, fan-out wafer-level package (FOWLP) is an enhancement of standard wafer-level package. In a FOWLP process, integrated circuits may be formed on a wafer and then packaged while still part of the wafer. The wafer may be diced afterwards. Since the diameter of a current large-size wafer is only around 300 mm, there is limited space for forming and packaging integrated circuits on the wafer. Thus, a development of fan-out panel level package (FOPLP) will be vitally important.

In a current FOPLP process, a multi-layer structure including conductive layers and isolation layers is typically disposed on a substrate, wherein the conductive layers and the isolation layers are arranged in an interleaved manner for forming a redistribution layer (RDL). In the quest for efficiency and economies of mass production, the RDL is normally distributed on as much the surface area of the substrate as possible for increasing the utilization rate of the substrate. However, the pursuit of higher substrate utilization rate tends to increase substrate warpage which is undesirable in an automatic production. Therefore, there is a need for a method of manufacturing an electronic device with reduced substrate warpage.

SUMMARY OF THE DISCLOSURE

The present disclosure provides a method of manufacturing an electronic device. The method includes providing a substrate which includes an active region and a peripheral region, providing an intermediate layer on the substrate, and providing an isolation layer on the intermediate layer. The peripheral region is adjacent to the active region. A ratio of an area of the active region to an area of a surface of the substrate is between 75% and 92% in a top-view of the electronic device. The isolation layer includes a first surface correspondingly disposed in the active region, and at least one first slope correspondingly disposed in the peripheral region and including a first angle.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

It will be understood that when an element or layer is referred to as being "on another component or on another layer" or "connected to another component or to another layer", it can be directly on or directly connected to the other element or layer, or intervening elements or layers may be presented. In contrast, when an element is referred to as being "directly on" or "directly connected to" another element or layer, there are no intervening elements or layers presented.

The electronic device according to the embodiments of the present disclosure may include a display device, a luminescent device, an antenna device or a packaging device, but not limited thereto. In the embodiment of packaging device, the electronic device may be a chip-first/face-down package or an RDL-first package, but not limited thereto.

The technical features in different embodiments described in the following may be replaced, recombined, or mixed with one another to constitute another embodiment without departing from the spirit of the present disclosure.

Figure 1:
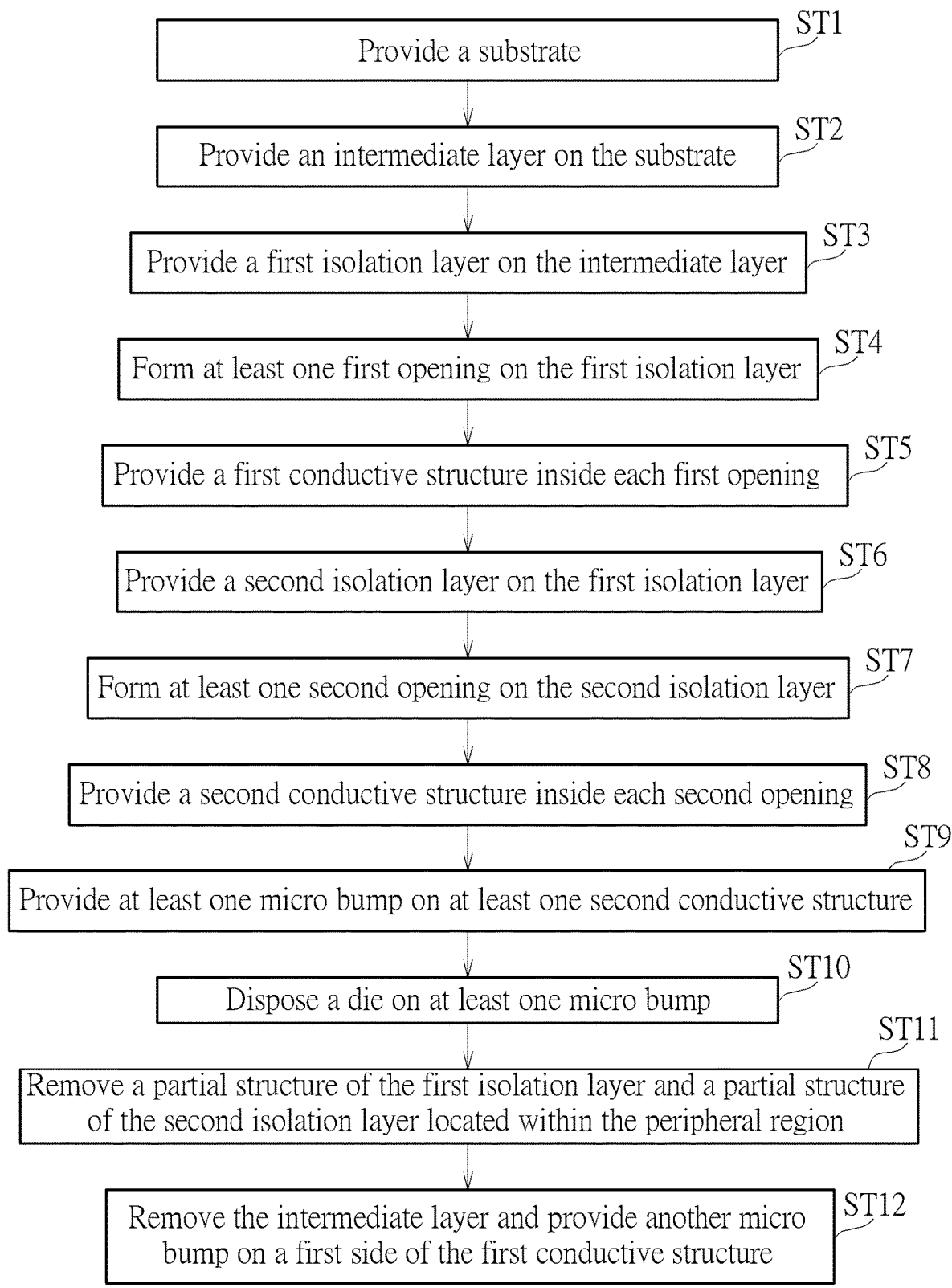
FIG. 1 is a flowchart illustrating a method of manufacturing an electronic device according to an embodiment of the present disclosure.

FIG. 1 is a flowchart illustrating a method of manufacturing an electronic device according to an embodiment of the present disclosure. The flowchart in FIG. 1 includes the following steps:

Step ST1: provide a substrate 110.
Step ST2: provide an intermediate layer 120 on the substrate 110.
Step ST3: provide a first isolation layer 131 on the intermediate layer 120.
Step ST4: form at least one first opening OP1 on the first isolation layer 131.
Step ST5: provide a first conductive structure 141 inside each first opening OP1.
Step ST6: provide a second isolation layer 132 on the first isolation layer 131.
Step ST7: form at least one second opening OP2 on the second isolation layer 132.
Step ST8: provide a second conductive structure 142 inside each second opening OP2.
Step ST9: provide at least one bump pad 150 on at least one second conductive structure 142.

Step ST10: dispose a die 160 on at least one micro bump 150.

Step ST11: remove a partial structure of the first isolation layer 131 and a partial structure of the second isolation layer 132 located within the peripheral region PR.

Step ST12: remove the intermediate layer 120 and provide another bump pad 151 on a first side of the first conductive structure 141.

Figure 2:
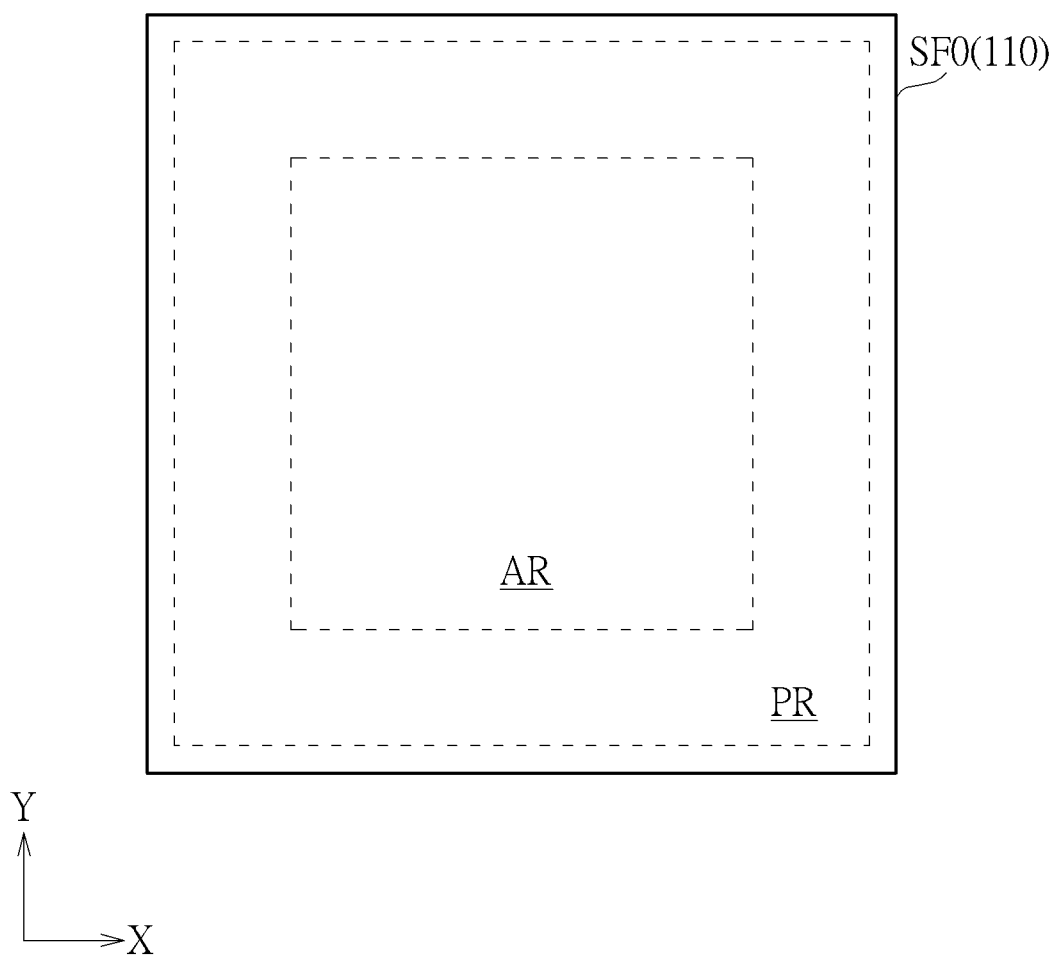
FIG. 2 is a diagram illustrating top-view of the electronic device according to an embodiment of the present disclosure.
Figure 3:
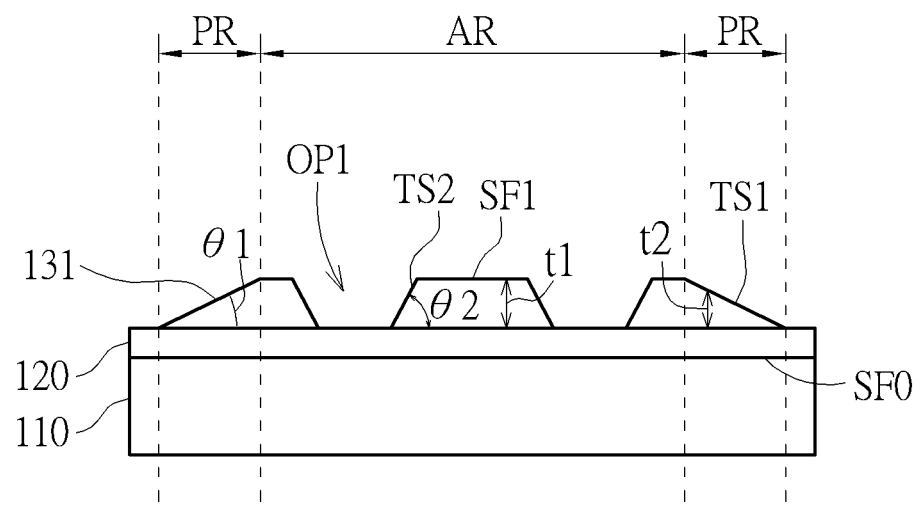
FIG. 3 to FIG. 10 are diagrams illustrating cross-sectional views of the electronic device at each stage of the manufacturing method in FIG. 1 according to an embodiment of the present disclosure.
Figure 4:
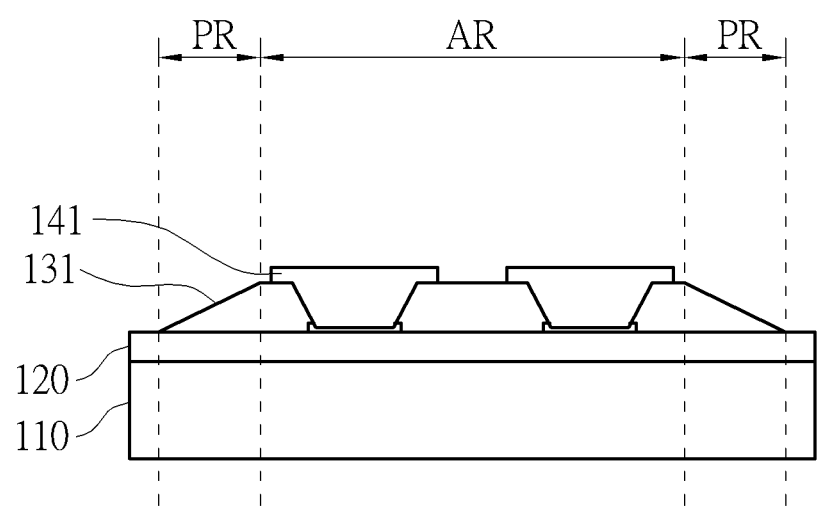
Figure 5:
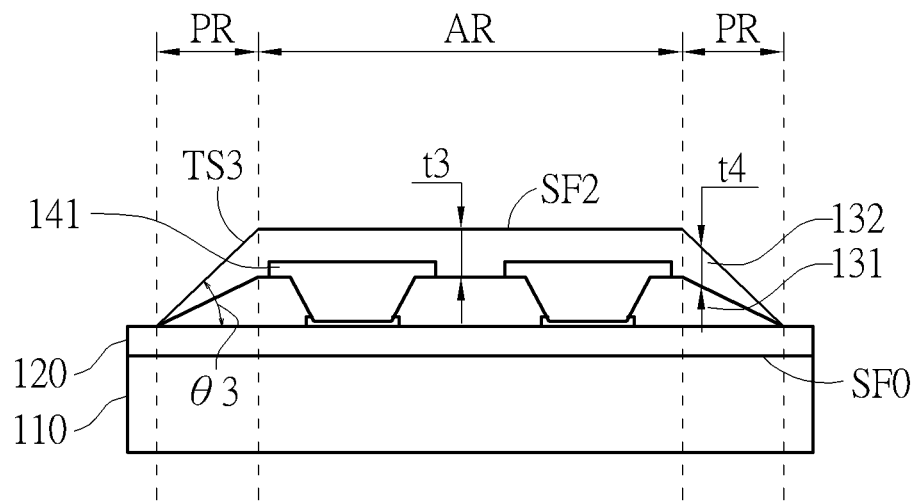
Figure 6:
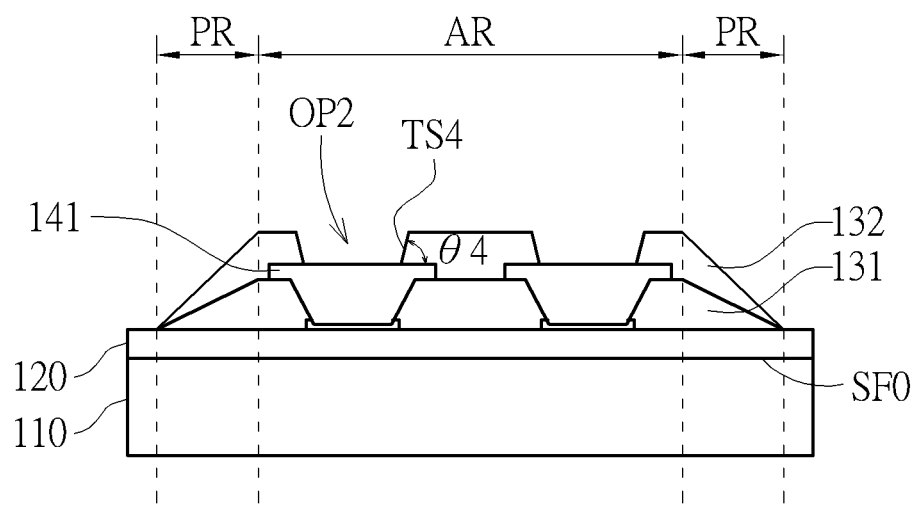
Figure 7:
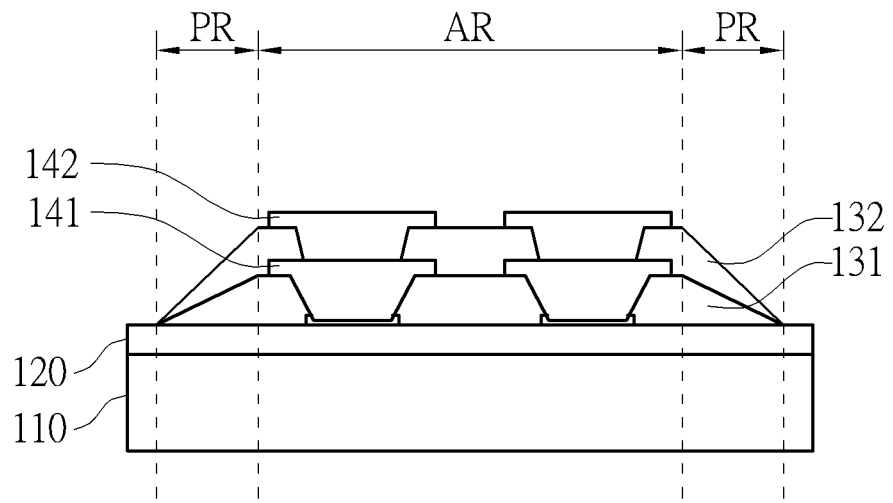
Figure 8:
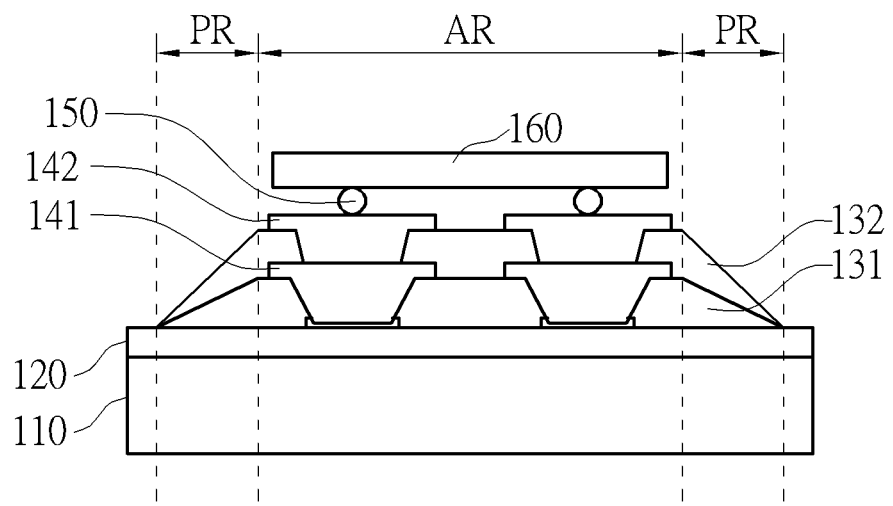
Figure 9:
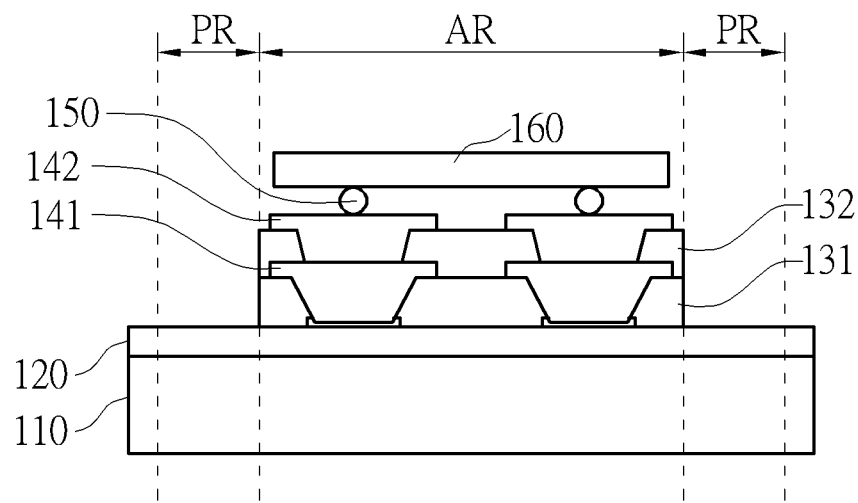

First, the substrate 110 may be provided in step ST1 of the present disclosure. FIG. 2 is a diagram illustrating the top-view of the substrate 110 according to an embodiment of the present disclosure. As depicted in FIG. 2, the surface SF0 of the substrate 110 includes an active region AR and a peripheral region PR, and the peripheral region PR is adjacent to the active region AR. In an embodiment of the present disclosure, the length and the width of the substrate 110 may each be 300 mm, wherein the ratio of the area of the active region AR to the area of the surface SF0 of the substrate 110 is between 75% and 92%. In an embodiment of the present disclosure, the substrate 110 may be a glass substrate, but not limited thereto.

As depicted in FIG. 2, in a top-viewing direction of the electronic device, the area of the surface SF0 of the substrate 110 may be the integral result of the length (along an X-direction) and the width (along a Y-direction) of the substrate 110, wherein the X-direction and the Y-direction are perpendicular to each other. The area of the active region AR may be an integral result of the projected region, and substrate warpage can be greatly reduced when the ratio of the area of the active region AR to the area of the surface SF0 of the substrate 110 is between 75% and 92%. According to some embodiments, the substrate 110 and the active area AR may be circular, trapezoidal or in any shape, based on which the integration method for acquiring the area of the surface SF0 of the substrate 110 or the area of the active region AR may be determined.

In the present disclosure, the active region AR includes a redistribution layer which is electrically connected to a die. More specifically, the active region AR includes a redistribution layer which is electrically connected to a known good die (KGD). In some embodiments, the active region AR may be viewed as the region which is overlapped with the die, but not limited thereto.

In the present disclosure, the peripheral region PR may be located outside the active region AR, be located adjacent to the active region AR or encircle the active region AR. The peripheral region PR may include a dummy region or an alignment mark region which is not electrically connected to a die. In some embodiments, the peripheral region PR may be viewed as the region which is not overlapped with the die, but not limited thereto. For example, in the substrate 110 including the active region AR and the peripheral region PR, the functionality of the conducting circuits in the active region AR may be tested by a test signal provided from the peripheral region PR and transmitted via the conducting circuits in the peripheral region PR. By testing whether a defect (short-circuit defect or open-circuit defect) is present in the conducting circuits in the active region AR, the known good region of the active region AR may be electrically connected to a KGD.

FIG. 3 to FIG. 10 are diagrams illustrating cross-sectional views of the electronic device at each stage of the manufacturing method in FIG. 1 according to an embodiment of the present disclosure.

Figure 10:
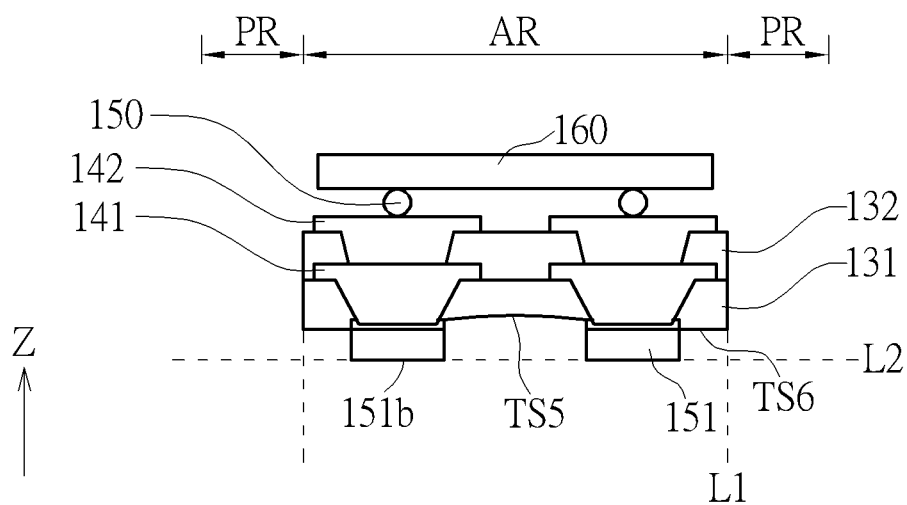

As depicted in FIG. 1 and FIG. 10, the intermediate layer 120 is provided on the substrate 110 in the present disclosure. The intermediate layer 120 may serve as a material layer for temporal bi-directional attachment/detachment in the electronic device. The material of the intermediate layer 120 may be determined according to the coating method, the manufacturing process and the manufacturing tool of the electronic device, but does not limit the scope of the present disclosure.

As depicted in FIG. 1 and FIG. 10, the first isolation layer 131 is provided on the intermediate layer 120 in the present disclosure. The first isolation layer 131 may serve as an isolation layer, a passivation layer, a buffer inner coating layer, or dielectric material between multiple metal layers. In an embodiment of the present disclosure, the material of the first isolation layer 131 may include non-conducting material such as, but not limited to, polyimide (PI), photosensitive polyimide (PSPI), benezocy-clobutene (BCB), polybenzoxazole (PBO), silicon oxide (SiOx), silicon nitride (SiNx), silicon oxide nitride (SiOxNy) or an Ajinomoto build-up film (ABF). In some embodiments, a conductive layer may be selectively provided between the intermediate layer 120 and the first isolation layer 131 for manufacturing subsequent layers. The above-mentioned conductive layer may include, but not limited to, a single-layer structure or a multi-layer structure.

In an embodiment of the present disclosure, the first isolation layer 131 includes a first surface SF1 and at least one slope TS1. The first surface SF1 is correspondingly disposed in the active region AR, such as correspondingly disposed on the top surface of the first isolation layer 131 in the active region AR. The slope TS1 is correspondingly disposed in the peripheral region PR, such as correspondingly disposed on the side surface of the first isolation layer 131 in the peripheral region PR. An angle θ1 is formed between the slope TS1 and the surface SF0 of the substrate 110, wherein the angle θ1 is smaller than 90 degrees. In some embodiments, the angle θ1 is between the slope TS1 and the surface of the intermediate layer, but not limit thereto. In some embodiments, the angle θ1 may be smaller than or equal to 30 degrees. In some embodiments, the angle θ1 may be smaller than or equal to 10 degrees.

In an embodiment, the first isolation layer 131 may be formed on the intermediate layer 120 using a coating process, a vapor deposition process or any suitable process in the present deposition, but not limited thereto. For example, during a coating process, the machine parameters may be adjusted so that the first isolation layer 131 includes at least one slope TS1 with the adjustable angle θ1. For example, during the process of forming the first isolation layer 131, the material of the first isolation layer 131 may be provided on the intermediate layer 120 by a dispenser operating at a spraying rate P1, or formed on the intermediate layer 120 by a coater operating at a coating rate V1. Due to the fluidity of the first isolation layer 131, the thickness t2 of the first isolation layer 131 in the peripheral region PR may be smaller than the thickness t1 of the first isolation layer 131 in the active region AR. In the present disclosure, the above-mentioned thickness refers to the thickness of the first isolation layer 131 measured along the N direction of the electronic device in the cross-sectional diagram. In the present disclosure, the above-mentioned thickness does not refer to the thickness at the intersection of the active region AR and the peripheral region PR. Also, the first isolation layer 131 may be provided using an exposure process and a mask design in the present disclosure, and the first isolation layer 131 may include at least one slope TS1 disposed in the peripheral region PR. In an embodiment, the exposure process may be weak exposure, but not limit thereto.

As depicted in FIG. 1 and FIG. 10, at least one first opening OP1 is formed through the first isolation layer 131 in the present disclosure. For example, the first isolation layer 131 may be exposed to form the at least one first opening OP1. Each first opening OP1 includes at least one slope TS2. An angle θ2 is formed between one of the at least one slope TS2 and the surface SF0 of the substrate 110, wherein the angle θ2 is larger than the angle θ1 and smaller than 90 degrees. In some embodiments, the angle θ2 is between the at least one slope TS2 and the surface of the intermediate layer 120, but not limit thereto. In some embodiments, the angle θ2 is larger than 45 degrees and smaller than 90 degrees. In some embodiments, the angle θ2 is larger than 60 degrees and smaller than 90 degrees. In some embodiments, the angle θ2 is larger than 70 degrees and smaller than 90 degrees. The attachability of the conductive structure and the isolation layer may be enhanced by setting the angle θ2 to be larger than or equal to 45 degrees and smaller than 90 degrees, but not limited thereto.

As depicted in FIG. 1 and FIG. 10, the first conductive structure 141 is provided inside at least one first opening OP1 in the present disclosure. The first conductive structure 141 may include a single-layer structure or a multi-layer structure. In an embodiment of the present disclosure, the material of the first conductive structure 141 may include copper, titanium or any other suitable metal material. The material of the first conductive structure 141 may be formed inside the first opening OP1 using a photolithography process, a deposition process, an electroplating process or any other suitable process, but not limited thereto.

As depicted in FIG. 1 and FIG. 10, the second isolation layer 132 is provided on the first isolation layer 131 in the present disclosure. The second isolation layer 132 may serve as an isolation layer, a passivation layer, a buffer inner coating layer, or dielectric material between multiple metal layers. In an embodiment of the present disclosure, the material of the second isolation layer 132 may include non-conducting material such as, but not limited to, PI, PSPI, BCB, PBO, SiOx, SiNx, SiOxNy or ABF. In some embodiments, the first isolation layer 131 and the second isolation layer 132 may include the same material or different materials.

In an embodiment of the present disclosure, the second isolation layer 132 includes a second surface SF2 and at least one slope TS3. The second surface SF2 is correspondingly disposed in the active region AR. The slope TS3 is correspondingly disposed in the peripheral region PR. An angle θ3 is formed between the at least one slope TS3 and the surface SF0 of the substrate 110, wherein the angle θ3 is smaller than 90 degrees. In some embodiments, the angle θ3 is between the at least one slope TS3 and the surface of the intermediate layer 120, but not limit thereto. In some embodiments, the angle θ3 is smaller than or equal to 60 degrees. In some embodiments, the angle θ3 is smaller than or equal to 10 degrees. In some embodiments, the angle 82 is greater than the angle θ3.

In an embodiment, the second isolation layer 132 may be formed on the first isolation layer 131 using a coating process, a vapor deposition process or any suitable process in the present deposition, but not limited thereto. For example, the machine parameters may be adjusted so that the second isolation layer 132 includes at least one slope TS3 with the adjustable angle θ3. For example, during the process of forming the second isolation layer 132, the material of the second isolation layer 132 may be provided on the first isolation layer 131 by a dispenser operating at a spraying rate P2, or formed on the first isolation layer 131 by a coater operating at a coating rate V2. Due to the fluidity of the second isolation layer 132, the thickness t4 of the second isolation layer 132 in the peripheral region PR may be smaller than the thickness t3 of the second isolation layer 132 in the active region AR. In the present disclosure, the second isolation layer 132 may be provided using a weak exposure and a mask design so that at least one slope TS3 may be presented in the structure of the second isolation layer 132 which is located in the peripheral region PR. In the present disclosure, the spraying rate P1 and the spraying rate P2 may have the same value or different values, and the coating rate V1 and the coating rate V2 may have the same value or different values. By adjusting the above-mentioned machine parameters, the thickness of first isolation layer 131 and the thickness of the second isolation layer 132 may have suitable values for reducing substrate warpage, but not limited thereto.

As depicted in FIG. 1 and FIG. 10, at least one second opening OP2 is formed through the second isolation layer 132 in the present disclosure. For example, the second isolation layer 132 may be exposed to form the at least one second opening OP2. Each second opening OP2 includes at least one slope TS4. An angle θ4 is formed between the at least one slope TS4 and the surface of the first conductive structure 141, wherein the angle θ4 is larger than the angle θ3 and smaller than 90 degrees. In some embodiments, the angle θ4 is formed between the at least one slope TS4 and the surface of the first isolation layer 131. In some embodiments, the angle θ4 is larger than 45 degrees and smaller than 90 degrees. In some embodiments, the angle θ4 is larger than 60 degrees and smaller than 90 degrees. In some embodiments, the angle θ4 is larger than 70 degrees and smaller than 90 degrees.

As depicted in FIG. 1 and FIG. 10, the second conductive structure 142 is provided inside at least one second opening OP2 in the present disclosure. The second conductive structure 142 may be used to provide electrical connection to the first conductive structure 141, but not limited thereto. The second conductive structure 142 may include a single-layer structure or a multi-layer structure. In an embodiment of the present disclosure, the material of the second conductive structure 142 may include copper, titanium or any other suitable metal material. The material of the second conductive structure 142 may be formed inside the second opening OP2 using a photolithography process, a deposition process, an electroplating process or any other suitable process, but not limited thereto.

As depicted in FIG. 1 and FIG. 10, the bump pad 150 is provided on the second conductive structure 142 for subsequent connection in the present disclosure. The material of the bump pad 150 may include tin, nickel, copper or any other suitable metal material. The material of the bump pad 150 may be directly formed on or bonded to the second conductive structure 142 using a printing process, a deposition process or any other suitable process, but not limited thereto. In some embodiments, the bump pad 150 may be provided on at least one second conductive structure 142 for subsequent connection, the die 160 may then be disposed on the bump pad 150, and a partial structure of the first isolation layer 131 located within the peripheral region PR may be removed, but not limited thereto. The die 160 is electrically connected to the second conductive structure 142 through the bump pad 150.

As depicted in FIG. 1 and FIG. 10, the die 160 is attached to at least one bump pad 150 in the present disclosure. In an embodiment, a glue (no shown) may be selectively filled between the die 160 and the second isolation layer 132, and at least one bump pad 150 may be reflowed using a thermal process, but not limited thereto.

As depicted in FIG. 1 and FIG. 10, the partial structure of the first isolation layer 131 and the partial structure of the second isolation layer 132 located within the peripheral region PR are removed in the present disclosure. In an embodiment, the partial structure of the first isolation layer 131 and the partial structure of the second isolation layer 132 located within the peripheral region PR may be removed using an etching process, a slicing process or any other suitable process, but not limited thereto.

As depicted in FIG. 1 and FIG. 10, the intermediate layer 120 is removed and another bump pad 151 is provided on the first side of the first conductive structure 141 in the present disclosure. In an embodiment, the first side and a second side of the first conductive layer 141 are two opposite sides of the first conductive layer 141 along the normal N of the electronic device, wherein the distance between the bump pad 150 and the first side of the first conductive layer 141 is larger than the distance between the bump pad 150 and the second side of the first conductive layer 141. In an embodiment, the first side and a second side of the first isolation layer 131 are two opposite sides of the first isolation layer 131 along the normal direction N of the electronic device, wherein the distance between the bump pad 150 and the first side of the first isolation layer 131 is larger than the distance between the bump pad 150 and the second side of the first isolation layer 131.

In an embodiment, another partial structure of the first isolation layer 131 may be removed after removing the intermediate layer 120, so that the first side of the first isolation layer 131 includes a bottom side TS5 and another bottom side TS6, wherein the bottom side TS5 is located between two adjacent bump pads 151 and the bottom side TS6 is located between the bump pad 151 and a first extension line L1 which passes through a lateral side of the first isolation layer 131 and a lateral side of the second isolation layer 132. In an embodiment, at least one of the bottom side TS5 and the bottom side TS6 includes a curved surface, but not limited thereto. In some embodiments, a roughness of the surfaces of the bottom side TS5 or a roughness of the bottom side TS6 is greater than a roughness of the second isolation layer 132, but not limited thereto. For example, the another partial structure of the first isolation layer 131 may be particle or pollution which is not desired. In some embodiments, the surface of the first isolation layer 131 is exposed after removing the intermediate layer 120.

A second extension line L2 passes through the bottom surface 151b of at least one of the two adjacent bump pads 151. In an embodiment, the bottom surface 151b may be located on a surface which is farthest from the die 160 along the normal direction N of the electronic device. In some embodiments, along the normal direction N of the electronic device, the distance between the bottom side TS5 and the second extension line L2 is different from the distance between the bottom side TS6 and the second extension line L2. For example, the distance between the bottom side TS5 and the second extension line L2 is larger than the distance between the bottom side TS6 and the second extension line L2. For example, a distance d1 between a top surface of the second isolation layer and the bottom side TS5 is smaller than a distance d2 between a top surface of the second isolation layer and the bottom side TS6. In an embodiment, the distance d1 is greater than equal to the distance d2 multiplied by 0.7 and smaller and equal to the distance d2 multiplied by 0.9, that is $0.7*d2 \leq d1 \leq 0.9*d2$. When $0.7*d2 \leq d1 \leq 0.9*d2$, the electronic device will have better reliability, but not limit thereto. In an embodiment, the normal direction N of the electronic device may be a Z-direction, the first extension line L1 is along the Z-direction, the second extension line L2 is along the X-direction or the Y-direction depicted in FIG. 2, wherein the X-direction, the Y-direction and the Z-direction are perpendicular to each other, and the normal direction N of the electronic device (Z-direction) is perpendicular to the surface SF0 of the substrate 110 (the X-Y plane depicted in FIG. 2).

In some embodiments, the electronic device may further include a protective packaging solution for the die 160. In some embodiments, the electronic device may further include a protective packaging solution for the die 160, the bump pad 150, the first isolation layer 131 and the first conductive layer 141. The protective packaging solution may reduce the impact of moisture on the reliability of the electronic device, but not limited thereto. In some embodiments, the first isolation layer 131, the second isolation layer 132, the first conductive layer 141 and the second conductive layer 142 are arranged in an interleaved manner for forming an RDL, wherein the first conductive layer 141 and the second conductive layer 142 may be electrically connected to each other. The packaged die 160 may provide fanned-out connections to other electronic devices via the RDL. The RDL may further include active devices (such as thin film transistors or capacitors) or passive devices for improving the efficiency of the electronic device, but not limited thereto.

In conclusion, the present disclosure may adjust the profile of the isolation layer in the peripheral region, thereby reducing substrate warpage without lowering the substrate utilization rate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method of manufacturing an electronic device, comprising:
   providing a substrate including an active region and a peripheral region, wherein the peripheral region is adjacent to the active region, and a ratio of an area of the active region to an area of a surface of the substrate is between 75% and 92% in a top-view of the electronic device;
   providing an intermediate layer on the substrate;
   providing a first isolation layer on the intermediate layer, the first isolation layer including:
      a first surface correspondingly disposed in the active region; and
      at least one first slope correspondingly disposed in the peripheral region and having a first angle; and
   forming at least one first opening through the first isolation layer, wherein the at least one first opening includes at least one second slope, and the at least one second slope includes a second angle larger than the first angle.

2. The method of claim 1, wherein a first thickness of the first isolation layer in the peripheral region is smaller than a second thickness of the first isolation layer in the active region.

3. The method of claim 1, further comprising:
providing the first isolation layer using an exposure process and a mask design, wherein the first isolation layer includes at least one first slope disposed in the peripheral region.

4. The method of claim 1, further comprising:
providing a first conductive structure inside the at least one first opening, wherein the first conductive structure includes multiple layers of metal material.

5. The method of claim 4, further comprising:
providing a second isolation layer on the first isolation layer, the second isolation layer including:
- a second surface correspondingly disposed in the active region; and
- at least one third slope correspondingly disposed in the peripheral region and including a third angle, wherein the second angle is larger than the third angle.

6. The method of claim 5, wherein:
the first isolation layer and the second isolation layer include polyimide (PI), photosensitive polyimide (PSPI), Benezocy-clobutene (BCB) or Polybenzoxazole (PBO).

7. The method of claim 5, wherein a third thickness of the second isolation layer in the peripheral region is smaller than a fourth thickness of the second isolation layer in the active region.

8. The method of claim 5, further comprising:
providing the second isolation layer using an exposure process and a mask design, wherein the at least one third slope of the second isolation layer is disposed in the peripheral region.

9. The method of claim 5, further comprising:
forming at least one second opening through the second isolation layer, wherein the at least one second opening includes at least one fourth slope, and the at least one fourth slope includes a fourth angle is larger than the third angle.

10. The method of claim 9, further comprising:
providing a second conductive structure inside the at least one second opening, wherein the second conductive structure includes multiple layers of metal material.

11. The method of claim 10, wherein:
the first conductive structure and the second conductive structure include copper or titanium.

12. The method of claim 9, further comprising:
providing at least one first bump pad on the second conductive structure;
disposing a die on the at least one first bump pad; and
removing a first partial structure of the first isolation layer and a partial structure of the second isolation layer located within the peripheral region.

13. The method of claim 12, further comprising:
reflowing the at least one first bump pad using a thermal process.

14. The method of claim 12, further comprising:
removing the intermediate layer; and
providing at least one second bump pad on a first side of the first conductive layer.

15. The method of claim 14, wherein:
the at least one first bump pad and the at least one second bump pad include tin, nickel or copper.

16. The method of claim 14, further comprising:
removing a second partial structure of the first isolation layer after removing the intermediate layer and the first isolation layer includes a first bottom side and a second bottom side, wherein:
a first extension line passes through a lateral side of the first isolation layer and a lateral side of the second isolation layer and extends along a normal direction of the electronic device;
the first bottom side is located between two adjacent second bump pads; and
the second bottom side is located between the at least one second bump pad and the first extension line.

17. The method of claim 16, wherein:
a second extension line passes through a bottom surface of the at least one second bump pad; and
a distance between the first bottom side and the second extension line is larger than a distance between the second bottom side and the second extension line.

18. The method of claim 1, wherein:
the active region includes a redistribution layer electrically connected to a die; and
the peripheral region includes a dummy region or an alignment mark region not electrically connected to the die.

* * * * *